(12) United States Patent
Nickel

(10) Patent No.: US 7,397,074 B2
(45) Date of Patent: Jul. 8, 2008

(54) RF FIELD HEATED DIODES FOR PROVIDING THERMALLY ASSISTED SWITCHING TO MAGNETIC MEMORY ELEMENTS

(75) Inventor: Janice H. Nickel, Sunnyvale, CA (US)

(73) Assignee: Samsung Electronics Co., Ltd. (KR)

( * ) Notice: Subject to any disclaimer, the term of this patent is extended or adjusted under 35 U.S.C. 154(b) by 491 days.

(21) Appl. No.: 11/034,418

(22) Filed: Jan. 12, 2005

(65) Prior Publication Data

US 2006/0163629 A1 Jul. 27, 2006

(51) Int. Cl.
*H01L 29/76* (2006.01)
*H01L 29/94* (2006.01)
*H01L 31/062* (2006.01)
*H01L 31/113* (2006.01)

(52) U.S. Cl. .............. 257/288; 257/104.1; 257/421; 257/701; 257/E21.229; 257/E21.293; 257/E21.304; 257/E21.278; 257/E21.352

(58) Field of Classification Search ............ 257/288, 257/104, 68, 296, 295, 421, 425, 427, 701, 257/910
See application file for complete search history.

(56) References Cited

U.S. PATENT DOCUMENTS

| | | | |
|---|---|---|---|
| 3,582,912 A | 6/1971 | Valin et al. | |
| 4,424,578 A | 1/1984 | Miyamoto | |
| 5,169,485 A | 12/1992 | Allen et al. | |
| 5,396,455 A | 3/1995 | Brady et al. | |
| 5,793,697 A * | 8/1998 | Scheuerlein | 365/230.07 |
| 6,016,290 A | 1/2000 | Chen et al. | |
| 6,028,786 A | 2/2000 | Nishimura | |
| 6,130,835 A | 10/2000 | Scheuerlein | |
| 6,163,477 A | 12/2000 | Tran | |
| 6,188,615 B1 | 2/2001 | Perner et al. | |
| 6,385,082 B1 | 5/2002 | Abraham et al. | |
| 6,535,416 B1 | 3/2003 | Daughton et al. | |
| 6,577,527 B2 | 6/2003 | Freitag et al. | |
| 6,603,678 B2 | 8/2003 | Nickel et al. | |
| 6,757,188 B2 | 6/2004 | Perner et al. | |
| 6,801,450 B2 | 10/2004 | Perner | |
| 6,819,586 B1 | 11/2004 | Anthony et al. | |
| 6,911,685 B2 * | 6/2005 | Anthony et al. | 257/295 |
| 6,912,153 B2 * | 6/2005 | Tihanyi | 365/158 |
| 6,930,369 B2 * | 8/2005 | Nickel et al. | 257/421 |

(Continued)

FOREIGN PATENT DOCUMENTS

JP 3207040 A 2/1991

(Continued)

OTHER PUBLICATIONS

U.S. Appl. No. 10/713,510, Nickel.

*Primary Examiner*—David Nhu
(74) *Attorney, Agent, or Firm*—Myers Bigel Sibley & Sajovec

(57) ABSTRACT

An exemplary array of thermally-assisted magnetic memory structures includes a plurality of magnetic memory elements, each magnetic memory element being near a diode. A diode near a selected magnetic memory element can be heated by absorbing energy from a radio frequency electromagnetic field. The heated diode can be used to elevate the temperature of the selected magnetic memory element to thermally assist in switching the magnetic state of the magnetic memory element upon application of a write current.

15 Claims, 9 Drawing Sheets

U.S. PATENT DOCUMENTS

| | | |
|---|---|---|
| 6,961,262 B2 * | 11/2005 | Perner .................. 365/158 |
| 7,180,770 B2 | 2/2007 | Perner et al. |
| 7,196,955 B2 | 3/2007 | Nickel |
| 2001/0019461 A1 | 9/2001 | Binnig |
| 2002/0089874 A1 | 7/2002 | Nickel et al. |
| 2003/0123282 A1 | 7/2003 | Nickel et al. |
| 2003/0218905 A1 | 11/2003 | Perner et al. |
| 2005/0104146 A1 | 5/2005 | Nickel et al. |
| 2005/0185456 A1 | 8/2005 | Nickel et al. |
| 2006/0215444 A1 | 9/2006 | Perner et al. |

FOREIGN PATENT DOCUMENTS

| | | |
|---|---|---|
| JP | 4023293 A | 1/1992 |
| JP | 5128884 A | 5/1993 |
| JP | 2000-076842 A | 3/2000 |
| JP | 2000-113666 A | 4/2000 |
| JP | 2000-285668 | 10/2000 |
| WO | WO 0075940 | 12/2000 |

* cited by examiner

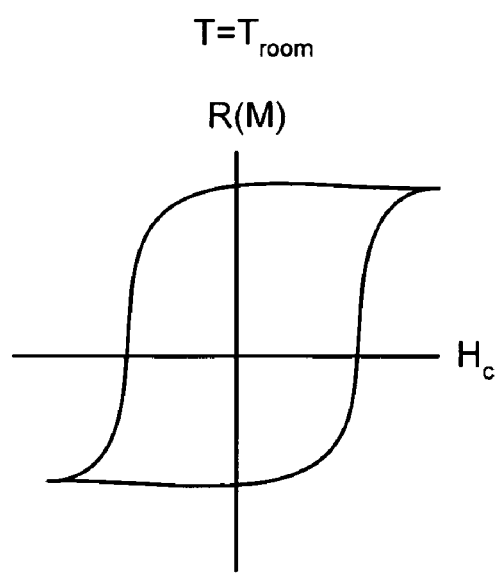
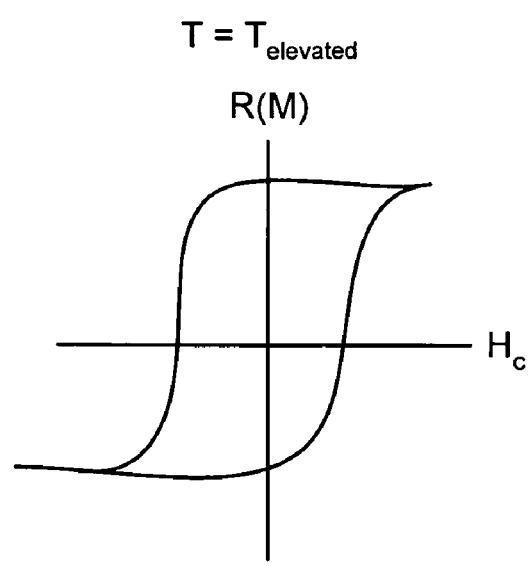
FIG. 3A          FIG. 3B

RF FIELD HEATED DIODES FOR PROVIDING THERMALLY ASSISTED SWITCHING TO MAGNETIC MEMORY ELEMENTS

BACKGROUND

A memory chip generally comprises a plurality of memory elements that are deposited onto a silicon wafer and addressable via an array of column conducting leads (bit lines) and row conducting leads (word lines). Typically, a memory element is situated at the intersection of a bit line and a word line. The memory elements are controlled by specialized circuits that perform functions such as identifying rows and columns from which data are read or to which data are written. Typically, each memory element stores data in the form of a "1" or a "0," representing a bit of data.

An array of magnetic memory elements can be referred to as a magnetic random access memory or MRAM. MRAM is generally nonvolatile memory (i.e., a solid state chip that retains data when power is turned off). FIG. 1 illustrates an exemplary magnetic memory element 100 of a MRAM in the related art. The magnetic memory element 100 includes a data layer 110 and a reference layer 130, separated from each other by at least one intermediate layer 120. The data layer 110 may also be referred to as a bit layer, a storage layer, or a sense layer. In a magnetic memory element, a bit of data (e.g., a "1" or "0") may be stored by "writing" into the data layer 110 via one or more conducting leads (e.g., a bit line and a word line). A typical data layer 110 might be made of one or more ferromagnetic materials. The write operation is typically accomplished via write currents that create two external magnetic fields that, when combined, set the orientation of the magnetic moment in the data layer to a predetermined direction.

Once written, the stored bit of data may be read by providing a read current through one or more conducting leads (e.g., a read line) to the magnetic memory element. For each memory element, the orientations of the magnetic moments of the data layer 110 and the reference layer 130 are either parallel (in the same direction) or anti-parallel (in different directions) to each other. The degree of parallelism affects the resistance of the element, and this resistance can be determined by sensing (e.g., via a sense amplifier) an output current or voltage produced by the memory element in response to the read current.

More specifically, if the magnetic moments are parallel, the resistance determined based on the output current is of a first relative value (e.g., relatively low). If the magnetic moments are anti-parallel, the resistance determined is of a second relative value (e.g., relatively high). The relative values of the two states (i.e., parallel and anti-parallel) are typically different enough to be sensed distinctly. A "1" or a "0" may be assigned to the respective relative resistance values depending on design specification.

The intermediate layer 120, which may also be referred to as a spacer layer, may comprise insulating material (e.g., dielectric), non-magnetic conductive material, and/or other known materials.

The layers described above and their respective characteristics are typical of magnetic memory elements based on tunneling magnetoresistance (TMR) effects known in the art. Other combinations of layers and characteristics may also be used to make magnetic memory elements based on TMR effects.

Still other configurations of magnetic memory elements are based on other well known physical effects (e.g., giant magnetoresistance (GMR), anisotropic magnetoresistance (AMR), colossal magnetoresistance (CMR), and/or other physical effects).

Throughout this application, various exemplary embodiments will be described in reference to the TMR memory elements as first described above. Those skilled in the art will readily appreciate that the exemplary embodiments may also be implemented with other types of magnetic memory elements known in the art (e.g., other types of TMR memory elements, GMR memory elements, AMR memory elements, CMR memory elements, etc.) according to the requirements of a particular implementation.

The various conducting leads (e.g., bit lines, word lines, and read lines) which are used to select the memory elements in a MRAM, and to read data from or write data to the memory elements are provided by one or more additional layers, called conductive layer(s). FIG. 2 illustrates an exemplary memory array 200 including magnetic memory elements 100a-100d that are selectable by bit lines 210a-210b, word lines 220a-220b, and read lines (not shown) during read or write operations. Magnetic memory elements 100a-100d are generally located at the cross-points of the bit lines 210a-210b and word lines 220a-220b.

The read lines may be located on top of or beneath (and insulated from) the bit lines 210a-210b or the word lines 220a-220b, or any other suitable configuration according to a particular implementation.

Conventional magnetic memory elements as described above may be written when currents in the bit line and word line intersecting at a selected memory element generate enough combined magnetic fields to switch the magnetic orientation of the data layer of the selected memory element. It is known that when a magnetic memory element is heated (e.g., to a temperature higher than ROOM temperature), the magnetic orientation of the data layer can be more easily switched (e.g., by a smaller combined magnetic field). Thus, thermally assisting switching of magnetic orientations in memory elements is often a desirable feature.

Thermal-assistance is typically provided by heater structures contacting or nearby the memory elements. For example, diodes in series with memory elements have been implemented to act as a heater to heat the memory elements. These diodes are heated by application of voltage in excess of the diode breakdown voltage to cause a reverse current to flow through the diode. The reverse current thereby heats the diodes. However, application of voltage in excess of the diode breakdown voltage can be costly.

Thus, a market exists for an alternative method to heat diodes that are near memory elements (e.g., coupled in series) with a reduced voltage and without necessarily causing a current to flow through the diodes.

SUMMARY

An exemplary array of thermally-assisted magnetic memory structures includes a plurality of magnetic memory elements, each magnetic memory element being near a diode. A diode near a selected magnetic memory element can be heated by absorbing energy from nearby radio frequency electromagnetic fields. The heated diode can be used to elevate the temperature of the selected magnetic memory element to thermally assist in switching the magnetic state of the magnetic memory element upon application of a write current.

Other embodiments and implementations are also described below.

BRIEF DESCRIPTION OF THE FIGURES

FIGS. 3A and 3B respectively illustrate exemplary coercivity at room temperature and exemplary coercivity at an elevated temperature for switching the magnetic orientation of a magnetic memory element.

DETAILED DESCRIPTION

I. Overview

Section II describes exemplary effects of heat on the coercivity of a magnetic memory element.

Section III describes reasons for placing a diode near a magnetic memory element.

Section IV describes exemplary alternative techniques for heating diodes.

Section V describes an exemplary process for making magnetic memory structures that can be heated as described in Section IV.

Section VI describes an exemplary top view of the magnetic memory structures of Section V.

Section VII describes exemplary applications of the exemplary magnetic memory structures.

II. Exemplary Effects of Heat on Coercivity

In many conventional MRAMs, a "1" or a "0" is written into a memory element by switching the magnetic orientation of the data layer in the memory element. The magnetic orientation is typically switched by (the vector sum of) magnetic fields resulting from write currents ($I_x$, $I_y$) flowing in two orthogonal write conductors (i.e., a bit line and a word line), one above and one below the memory element. The selected memory element experiences a bit line field and a word line field, while other memory elements on the selected row and column experience only one of the bit line field and word line field.

In a thermally-assisted (but otherwise conventional) MRAM, a selected memory element is heated just prior to or during a write operation. As a result of the increased heat, the coercivity (i.e., the ease of switching the magnetic orientation of the memory element) of the heated memory element is reduced and smaller switching magnetic fields are required to write that memory element.

FIG. 3A illustrates an exemplary graph of coercivity (Hc) at room temperature and FIG. 3B illustrates an exemplary graph of coercivity (Hc) at an elevated temperature (e.g., 50 degrees C. above room temperature). At the elevated temperature, the magnetic orientation of the data layer of a magnetic memory element switches at a lower combined magnetic field. Therefore, heating a magnetic memory element allows the magnitudes of one or both of the write currents ($I_x$, $I_y$) to be reduced. But even if the magnitudes of one or more write currents are not reduced a heated magnetic memory element will switch more reliably than an unheated magnetic memory element in the presence of a combined magnetic field. Thus, the degree of heating of a selected magnetic memory element, and the write currents applied to the memory element, can be adjusted (e.g., traded off) depending on a desired switching reliability.

III. Diodes in Close Proximity to Magnetic Memory Elements

Figure 1:
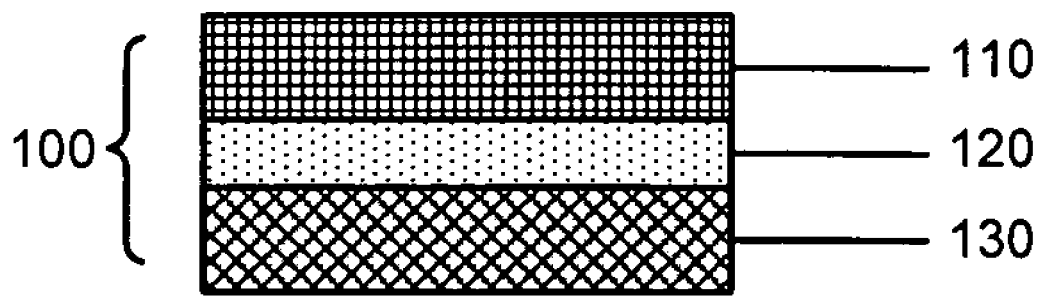
FIG. 1 illustrates an exemplary magnetic memory element in the related art.
Figure 2:
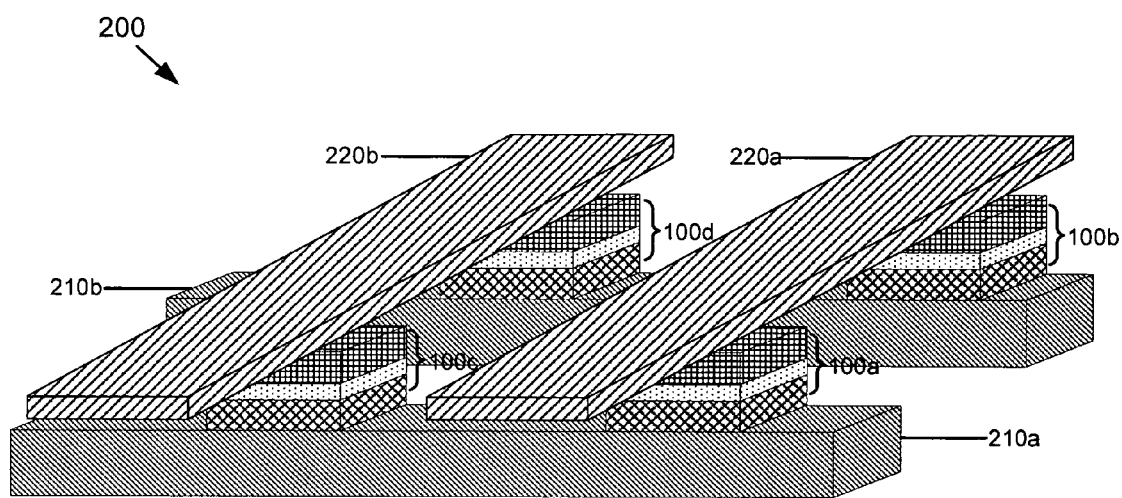
FIG. 2 illustrates an exemplary memory array having a plurality of magnetic memory elements in the related art.
Figure 4:
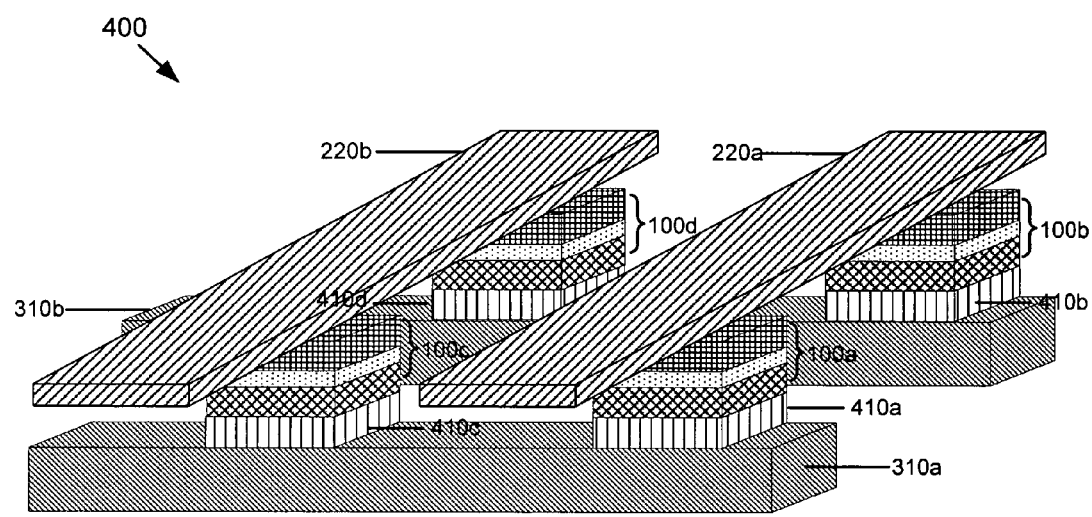
FIG. 4 illustrates an exemplary memory array having diodes near magnetic memory elements.

FIG. 4 illustrates an exemplary memory array 400 including magnetic memory elements 100a-100d that are selectable by bit lines 210a-210b, word lines 220a-220b, and read lines (not shown) during read or write operations. Magnetic memory elements 100a-100d are generally located at the cross-points of the bit lines 210a-210b and word lines 220a-220b but do not necessarily have to make electrical contact with the bit and word lines 210 and 220. The read lines may be located on top of or beneath (and insulated from) the bit lines 210a-210b or the word lines 220a-220b, or any other suitable configuration according to a particular implementation. In some other implementations, the read lines may be unnecessary. In these implementations, one or more of the bit lines 210a-210b or word lines 220a-220b may be used as read lines. The exemplary memory array 400 also includes diodes 410a-410d near the magnetic memory elements 100a-100d. In an exemplary implementation, the diodes 410a-410d are coupled in series with respective magnetic memory elements 100a-100d.

Diodes coupled in series with magnetic memory elements can provide many advantages. For example, the diodes can reduce and/or prevent undesired currents from flowing through any unselected magnetic memory elements. Further, diodes can increase the effective impedance through any unselected magnetic memory elements. Increased impedance in turn reduces the attenuation of the current sensed during a read operation, and has also been shown to reduce noise. Therefore, an improved signal-to-noise ratio may be obtained. Diodes coupled in series with magnetic memory elements can also improve write current uniformity by increasing resistance in unselected paths in the memory array so the write current does not get diverted by unselected memory elements. These and other advantages of diodes being coupled in series with magnetic memory elements are described in more detail in pending patent application Ser. No. 10/151,913, to Perner et al., and assigned to the same assignee as the present application, which pending application is hereby incorporated by reference for all purposes.

In addition to the many advantages described above, diodes coupled in series with (or simply in close proximity to) magnetic memory elements can also be used as heaters to heat their respective elements. For example, a selected memory element can be heated by a nearby heated diode. Diodes may be heated, for example, by applying a voltage in excess of the diode breakdown voltage to cause a reverse current to flow through the diode. The reverse current thereby heats the diode.

Alternative ways to heat a diode are the subject of this application and are described herein.

IV. Exemplary Alternative Techniques for Heating Diodes

Figure 5:
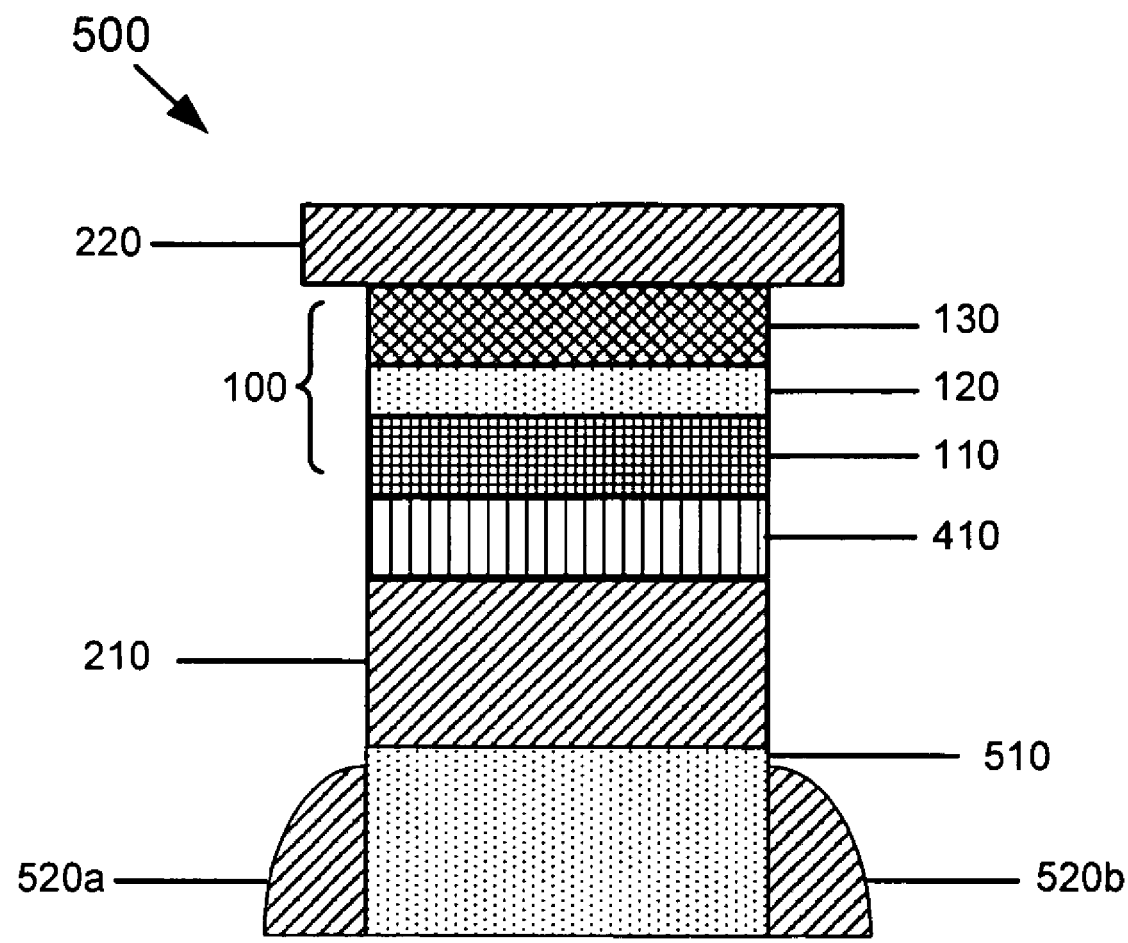
FIG. 5 illustrates an exemplary cross-sectional view of a magnetic memory structure having additional conductors near a diode proximate to a top-pinned magnetic memory element.

FIG. 5 illustrates an exemplary magnetic memory structure 500 that enables heating of a diode near a magnetic memory element without necessarily applying a voltage in excess of the diode breakdown voltage.

The memory structure 500 includes a magnetic memory element 100 (which includes a data layer 110, a spacer layer 120, and a reference layer 130), a diode 410 near the magnetic memory element 100 (e.g., coupled in series with the magnetic memory element 100), a first write conductor 210 (e.g., a bit line) and a second write conductor 220 (e.g., a word line), a pair of additional conductors 520a-520b, and an insulating material (e.g., dielectric) 510 for insulating the first write conductor 210 from the additional conductors 520a-520b.

In the memory structure 500, the diode 410 comprises one or more materials capable of absorbing energy from radio frequency electromagnetic fields. For example, the diode 410 may include amorphous silicon and/or microcrystalline silicon. The physical configuration of the diode may include a n-type silicon layer on top of a p-type silicon layer (or the reverse). One skilled in the art will recognize that other diode configurations (e.g., different geometies) known in the art can be alternatively implemented.

The diode 410 can be heated by supplying a small current through the additional conductors 520a-520b at a frequency suitable for the particular diode material(s). The current running in the additional conductors 520a-520b generates radio frequency electromagnetic fields that are absorbable by the diode 410. The diode 410 is then heated after absorbing the radio frequency electromagnetic fields. In general, the current in the additional conductors 520a-520b can be supplied by applying a voltage smaller than the diode breakdown voltage, and little or no current needs to flow through the diode to heat the diode.

The diode 410 need not be coupled in series with the magnetic memory element 100 to heat the element so long as the diode 410 is located near enough to heat the data layer 110 of the magnetic memory element 100, for example, immediately prior to or during a write operation. For example, the diode 410 can be located adjacent to (e.g., on top of) the reference layer 130 instead. However, if the diode 410 is coupled in series with the magnetic memory element 100, the diode 410 can also provide additional advantages as described above in Section III.

In an exemplary implementation, the additional conductors 520a-520b comprise one or more conductive materials such as Cu, Al, AlCu, Ta, W, Au, Ag, alloys of one or more of the above, and/or other conductive material(s) and alloy(s).

The physical configurations of the additional conductors 520a-520b and the diode 410 illustrated in FIG. 5 are merely exemplary. One skilled in the art will readily appreciate that the additional conductors 520a-520b can be implemented proximate to (e.g., in the vicinity of, near, etc.) the diode 410 so that the radio frequency electromagnetic fields emanating from the conductors can be effectively absorbed by the diode 410 to heat the diode 410 to a desired temperature.

Memory structures having additional layers are also known in the art and may be implemented in various embodiments to be described herein in accordance with a particular design choice. For example, another magnetic memory structure may also include a seed layer, an antiferromagnetic (AFM) layer, a protective cap layer, and/or other layers. The seed layer enhances crystalline alignment within the AFM layer. Exemplary materials for a seed layer include Ta, Ru, NiFe, Cu, or combinations of these materials. The AFM layer enhances magnetic stability in the reference layer 130. Exemplary materials for an AFM layer include IrMn, FeMn, NiMn, PtMn, and/or other well known materials. The protective cap layer protects the data layer 110 from the environment (e.g., by reducing oxidation of the data layer 110) and may be formed using any suitable material known in the art. Exemplary materials for a protective cap layer include Ta, TaN, Cr, Al, Ti, and/or still other materials. For ease of explanation, these additional layers are not shown in the Figures.

The write conductors 210 and 220 may be made of Cu, Al, AlCu, Ta, W, Au, Ag, alloys of one or more of the above, and/or other conductive material(s) and alloy(s). The write conductors 210 and 220 may be formed by deposition or other techniques known in the art (e.g., sputtering, evaporation, electroplating, etc.). The write conductors 210 and 220 illustrated in FIG. 5 are merely exemplary. Those skilled in the art will appreciate that other configurations can also be implemented in accordance with any particular design choice. For example, one or more write conductors 210 and 220 may be at least partially cladded by a ferromagnetic cladding material, or thermally insulated from the memory element 100 by an insulating material (e.g., dielectric, air, a vacuum, etc.), etc. If a cladding is implemented, the cladding may comprise one or more materials having low thermal conductivity (e.g., amorphous metallic, doped semiconductor, and/or other materials or alloys) and/or ferromagnetic properties. If a cladding is implemented, for example, in the second write conductor 220, the memory element 100 may make electrical contact with a portion of the cladding instead of the write conductor 220 to reduce heat transfer through the write conductor 220.

The data layer 110 may comprise one or more ferromagnetic materials. In an exemplary embodiment, ferromagnetic materials suitable for the data layer 110 include, without limitation, NiFe, NiFeCo, CoFe, amorphous ferromagnetic alloys (e.g., CoZrNb, CoFeB), and other materials. In an exemplary implementation, the data layer 110 comprises a ferromagnet (FM) in contact with an antiferromaget (AFM). By coupling a FM layer to an AFM layer, a desired temperature dependence of the data layer coercivity may be obtained. For example, high coercivity may be achieved at room temperature due to a large FM-AFM exchange anisotropy. High room temperature coercivity may prevent inadvertent writing of unselected memory elements on selected rows and/or columns. Examples of AFM materials include, without limitation, iridium manganese (IrMn), iron manganese (FeMn), nickel manganese (NiMn), nickel oxide (NiO), platinum manganese (PtMn), and/or other materials.

In an exemplary embodiment, the spacer layer 120 is a tunnel barrier layer (e.g., if the memory element 100 is a TMR memory element). In this embodiment, the spacer layer 120 may be made of $SiO_2$, $SiN_x$, MgO, $Al_2O_3$, $AlN_x$, and/or other insulating materials.

In another exemplary embodiment, the spacer layer 120 is a non-magnetic conductive layer (e.g., if the memory element 100 is a GMR memory element). In this embodiment, the spacer layer 120 may be made of Cu, Au, Ag, and/or other non-magnetic conductive materials.

The reference layer 130 may comprise a single layer of material or multiple layers of materials. For example, the reference layer 130 may comprise one or more ferromagnetic materials. In an exemplary embodiment, ferromagnetic materials suitable for the reference layer 130 include NiFe, NiFeCo, CoFe, amorphous ferromagnetic alloys (e.g., CoZrNb, CoFeB), and other materials.

In generally, a memory structure may be made in a top-pinned configuration (where the reference layer 130 is on top of the data layer 110) or a bottom-pinned configuration (where the reference layer 130 is below the data layer 110). FIG. 5 illustrates an exemplary top-pinned configuration and FIG. 6 illustrates and exemplary bottom-pinned configuration.

Figure 6:
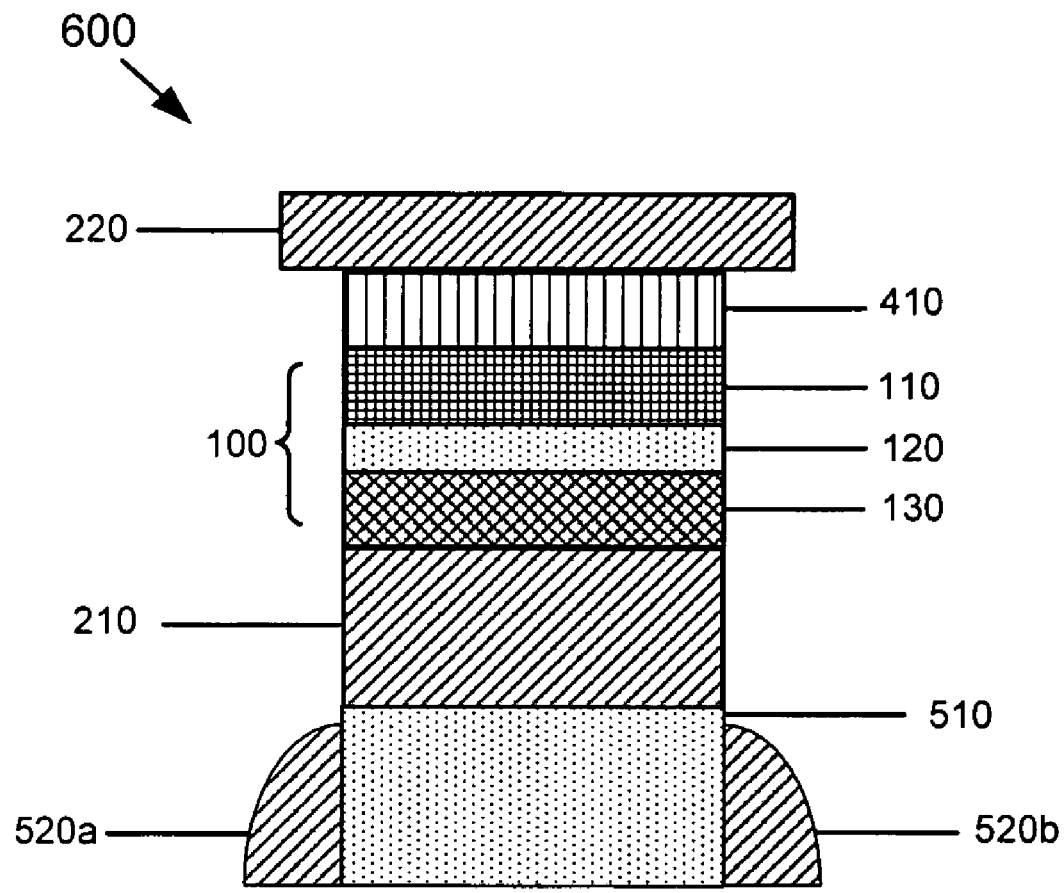
FIG. 6 illustrates an exemplary cross-sectional view of a magnetic memory structure having additional conductors near a diode proximate to a bottom-pinned magnetic memory element.

FIG. 6 illustrates an exemplary magnetic memory structure 600. In the magnetic memory structure 600, the diode 410 is implemented on top of the (bottom-pinned) magnetic memory element 100. One skilled in the art will recognize that the location of the diode 410 as illustrated is merely exemplary. In addition, the diode 410 need not be coupled in series with the magnetic memory element 100 to heat the element so long as the diode 410 is located near enough to heat the data layer 110 of the magnetic memory element 100, for example, immediately prior to or during a write operation. For example, the diode 410 can be located adjacent to (e.g., below) the reference layer 130 instead.

Figure 7:
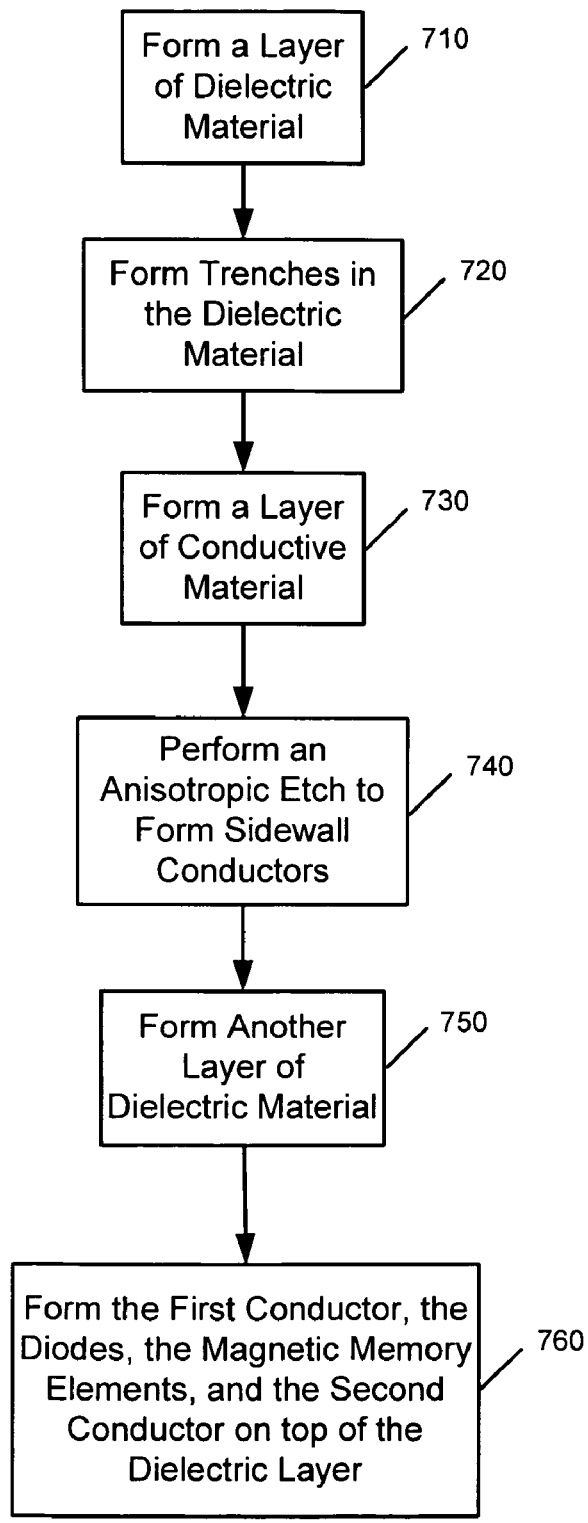
FIG. 7 illustrates an exemplary process for forming the magnetic memory structures of FIG. 5 or 6.

FIG. 7 below describes an exemplary process for making the memory structures 500 or 600.

V. An Exemplary Process to Make the Magnetic Memory Structures of FIG. 5 or 6

FIG. 7 illustrates an exemplary process for making the magnetic memory structures 500 or 600. FIGS. 8A-8F illustrate exemplary magnetic memory structures being made in accordance with the process steps of FIG. 7.

Figure 8A:
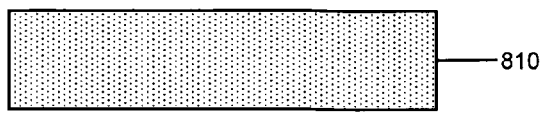
FIGS. 8A-8F illustrate exemplary magnetic memory structures being fabricated in accordance with the exemplary process of FIG. 7.

At step 710, a layer of dielectric material is formed by deposition or other similar techniques known in the art. In an exemplary implementation, the dielectric material formed is planarized by a planarizing process such as chemical mechanical planarization (CMP). An exemplary layer of planarized dielectric material 810 is illustrated in FIG. 8A.

Figure 8B:
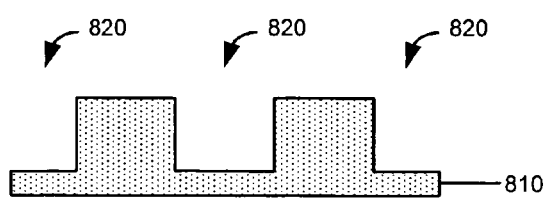

At step 720, trenches are formed in the dielectric material by a dry or wet etch process known in the art. FIG. 8B illustrates the exemplary layer of dielectric material 810 with trenches 820.

Figure 8C:
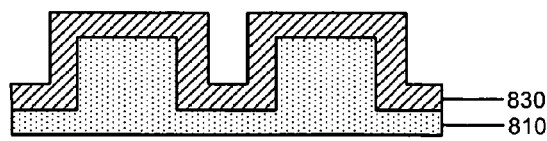

At step 730, a layer of conductive material is formed by deposition or other similar techniques known in the art. FIG. 8C illustrates an exemplary layer of conductive material 830 above the layer of dielectric material 810.

Figure 8D:
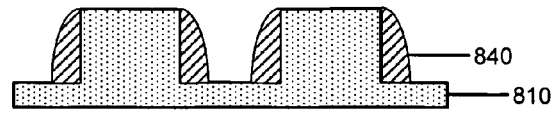

At step 740, an anisotropic etch is performed to differentially etch the conductive material. In an exemplary implementation, the anisotropic etch removes the conductive materials on the top and bottom surfaces but leaves the conductive materials on the sidewalls of the trenches substantially intact. Techniques for performing anisotropic etches are well known in the art and need not be described in detail herein. FIG. 8D illustrates exemplary conductive materials 840 on the sidewalls of the trenches.

Figure 8E:
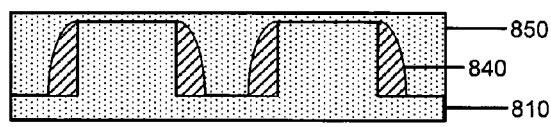

At step 750, another layer of dielectric material is formed by deposition or other similar techniques known in the art. In an exemplary implementation, the dielectric material formed is planarized by a planarizing process such as chemical mechanical planarization (CMP). FIG. 8E illustrates another layer of planarized dielectric material 850 formed on top of the conductive materials 840 and the first layer of dielectric material 810.

Figure 8F:
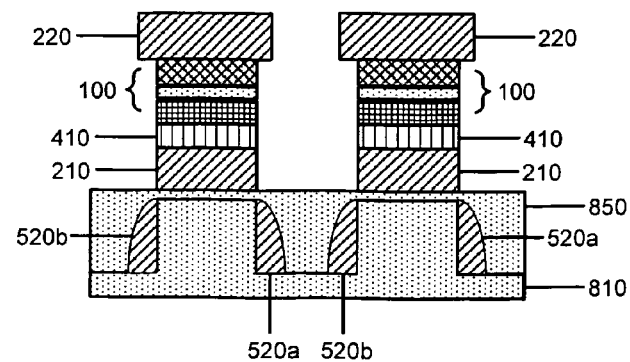

At step 760, the first conductors 210, the diodes 410, the magnetic memory elements 100, and the second conductors 220 are formed on top of the structure of FIG. 8E by techniques known in the art. FIG. 8F illustrates exemplary magnetic memory structures similar to structure 500 of FIG. 5. In FIG. 8F, the conductive materials 840 can be coupled to a decoder and a power source (shown in FIG. 9) to form additional conductors 520a-520b.

For ease of explanation, only the top-pinned configuration is shown in FIG. 8F. One skilled in the art will readily appreciate that the bottom-pinned configuration (e.g., as structure 600 of FIG. 6) may alternatively be implemented using the exemplary processes disclosed herein in accordance with any particular design requirement.

VI. An Exemplary Top View of an Exemplary Array of Magnetic Memory Structures

Figure 9:
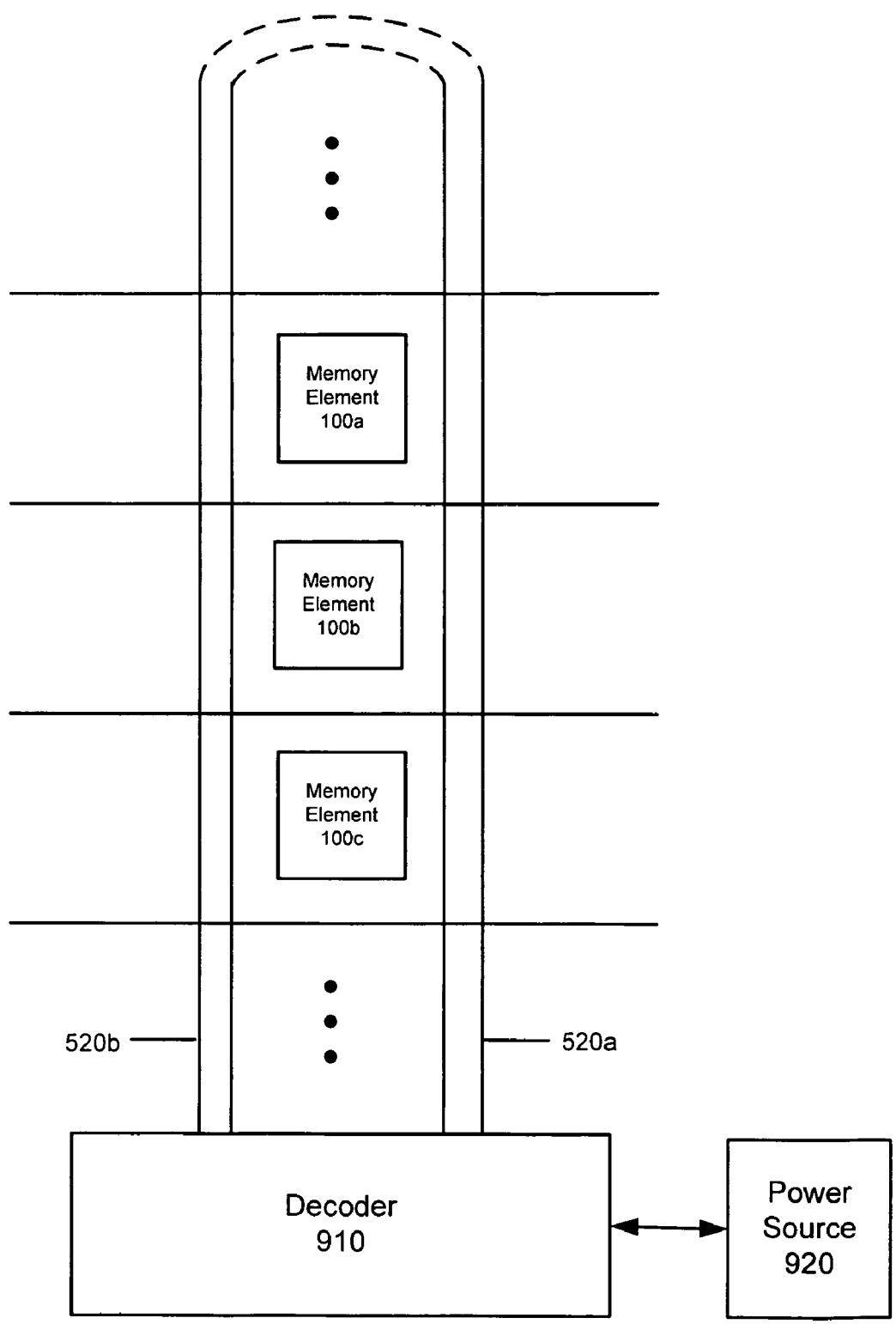
FIG. 9 illustrates an exemplary top view of an array of magnetic memory structures having additional conductors near an array of magnetic memory elements.

FIG. 9 illustrates an exemplary top view of additional conductors 520a-520b being formed near an array of magnetic memory elements 100a-100c. For ease of explanation, various other elements in the magnetic memory structures are not shown (e.g., the write conductors, diodes, various layers of the magnetic memory elements, etc.).

The additional conductors 520a-520b are connected (at one end) to a decoder 910 and a power source 920 for providing a current at a radio frequency usable for heating diodes 410 (not shown) near the magnetic memory elements 100a-100c. In an exemplary implementation, for each row (or column) of magnetic memory elements, the additional conductors 520a-520b are connected (at another end) to each other. Thus, when a magnetic memory element in a row is selected (e.g., in a write operation), the decoder 910 coupled with the power source 920 will supply sufficient current to the additional conductors 520a-520b of that row to heat all the diodes in the row. In an exemplary write operation, separate write currents will be supplied in the write conductors 210 and 220 (not shown) that intersect at the selected magnetic memory element. The combined magnetic fields emanating from both the intersecting write conductors 210 and 220 will effectively switch the magnetic orientation of the selected (and heated) memory element. The other (heated) magnetic memory elements in the row having heated diodes will experience magnetic field emanating from only one of the two write conductors 210 and 220, which is not sufficient to switch their magnetic orientation.

In yet another exemplary implementation, the diodes in the selected row may be heated enough such that write current being supplied via a single column write conductor intersecting a selected magnetic memory element (which is located in the selected row) is used to switch the magnetic orientation of the selected (and heated) memory element.

VII. Exemplary Applications of the Exemplary Magnetic Memory Structures

The exemplary magnetic memory structures described herein may be implemented in any MRAM. A MRAM can be implemented in any system that requires a non-volatile memory. For example, a MRAM may be implemented in a computer, a digital camera, and/or other computing systems having a processor and an interface module.

VIII. Conclusion

The foregoing examples illustrate certain exemplary embodiments from which other embodiments, variations, and modifications will be apparent to those skilled in the art. The inventions should therefore not be limited to the particular embodiments discussed above, but rather are defined by the claims.

What is claimed is:

1. An array of thermally-assisted magnetic memory structures, each of said thermally-assisted magnetic memory structures comprising:
    a magnetic memory element; and
    a diode near said magnetic memory element, said diode capable of being heated by absorbing energy from a radio frequency electromagnetic field in a vicinity of said diode and, when heated, said diode capable of elevating a temperature of said magnetic memory element to thermally assist in switching a magnetic state of said magnetic memory element upon application of a write current.

2. The magnetic memory structure of claim 1, further comprising at least one conductor near said diode configured to generate said radio frequency electromagnetic field.

3. The magnetic memory structure of claim 1, wherein said diode is coupled in series with said magnetic memory element.

4. The magnetic memory structure of claim 1, wherein said diode comprises a material able to absorb energy from said radio frequency electromagnetic field.

5. The magnetic memory structure of claim 4, wherein said material includes amorphous silicon.

6. The magnetic memory structure of claim 4, wherein said material includes microcrystalline silicon.

7. The magnetic memory structure of claim 1, wherein said magnetic memory element comprises a data layer, a spacer layer, and a reference layer.

8. The magnetic memory structure of claim 7, wherein said data layer is characterized in that its magnetic coercivity becomes reduced when its temperature becomes elevated.

9. The magnetic memory structure of claim 1, wherein said diode isolates said magnetic memory element from other magnetic memory elements in said array.

10. A magnetic random access memory comprising:
a plurality of magnetic memory elements;
a plurality of diodes each being in close proximity to a respective one of said magnetic memory elements;
at least one conductor near said diodes, said at least one conductor being capable of carrying a current to generate radio frequency electromagnetic fields absorbable by said diodes to heat said diodes to thereby elevate a temperature of one or more magnetic memory elements to thermally assist in switching a magnetic orientation thereof.

11. The memory of claim 10, wherein each of said diodes is coupled in series with a respective one of said magnetic memory elements.

12. The memory of claim 10, wherein said diodes comprise amorphous silicon material.

13. The memory of claim 10, wherein said diodes comprise microcrystalline silicon material.

14. The memory of claim 10, further comprising a decoder coupled to said conductor and operable to select said magnetic memory elements for heating.

15. An apparatus for writing data to a thermally-assisted magnetic memory element in an array of memory elements, comprising:
means for heating a diode near a selected memory element, said diode being heated by absorbing energy from a radio frequency electromagnetic field in a vicinity of said diode and elevating a temperature of said selected memory element, thereby reducing a magnetic coercivity of said selected memory element; and
means for applying a write current sufficient to switch a magnetic state of said selected memory element at said reduced magnetic coercivity.

* * * * *